Figure 1:
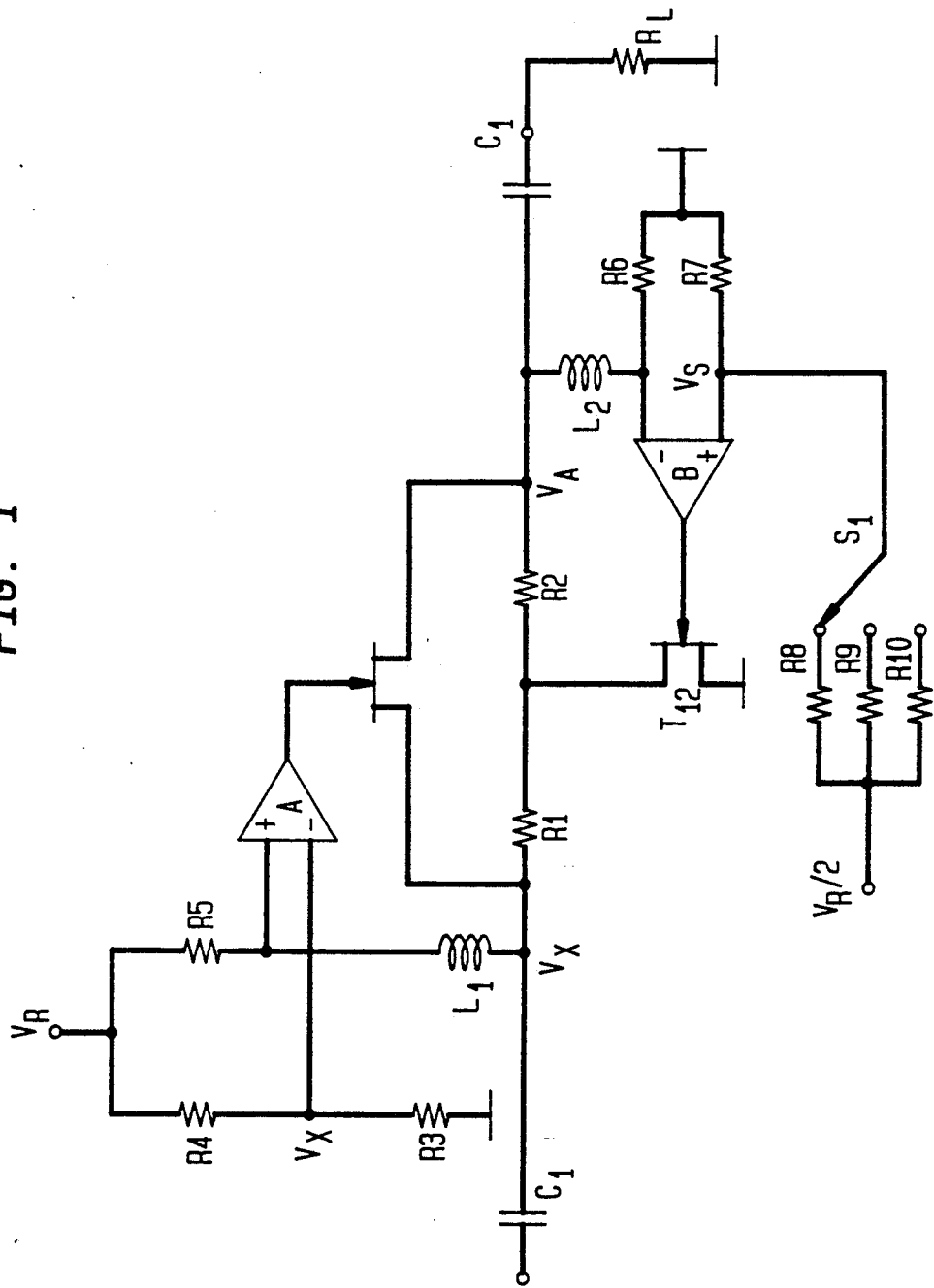

United States Patent

Lauper

[11] Patent Number: 5,087,899
[45] Date of Patent: Feb. 11, 1992

[54] VARIABLE ATTENUATION NETWORK WITH CONSTANT INPUT AND OUTPUT RESISTANCES

[75] Inventor: Alfred Lauper, Zürich, Switzerland

[73] Assignee: Siemens-Albis AG, Zuerich, Switzerland

[21] Appl. No.: 353,921

[22] Filed: May 19, 1989

[30] Foreign Application Priority Data

May 19, 1988 [CH] Switzerland ......... 01906/88

[51] Int. Cl.$^5$ ............................. H03H 11/24
[52] U.S. Cl. ................... 333/81 R; 307/567; 307/568
[58] Field of Search ............... 333/81 R, 81 A; 307/540, 544, 568, 567, 565

[56] References Cited

U.S. PATENT DOCUMENTS 4,875,023  10/1989  Maoz .................. 333/81 R

FOREIGN PATENT DOCUMENTS 148706    7/1985  European Pat. Off. ......... 333/81 R
2546405   4/1977  Fed. Rep. of Germany .
54-91034  7/1979  Japan .
215108   12/1984  Japan ................. 333/81 A
137906    6/1987  Japan ................. 333/81 R

OTHER PUBLICATIONS

Symposium Digest of Papers, Editor: Barry E. Spielman; Sponsored by the IEEE Microwave Theory and Techniques Society, pp. 75-79.

"GaAs Monolithic Wideband (2-18 GHz) Variable Attenuators", Y. Tajima et al., 1982 IEEE MTT-S International Microwave Symposium Digest, Jun. 15-17, 1982, Dallas, Tex., pp. 479-481.

"Surface-Mounted GaAs Active Splitter and Attenuator MMIC's Used in a 1-10-GHz Leveling Loop", Barta et al., IEEE Transactions on Microwave Theory and Techniques, vol. MTT-34, No. 12, Dec. 1986.

"A 2 to 8 GHz Leveling Loop Using a GaAs MMIC Active Splitter and Attenuator", Barta et al., IEEE 1986 Microwave and Millimeter-Wave Monolithic Circuits.

*Primary Examiner*—Paul Gensler
*Assistant Examiner*—Benny Lee
*Attorney, Agent, or Firm*—Adel A. Ahmed

[57] ABSTRACT

An attenuation network comprises a T or a $\pi$ network and first and second regulating circuits for controlling it. The T or $\pi$ network has at least two variable resistances. A switch S1 permits selection of a desired attenuation value which is set through the operation of the second regulating circuit on the T or $\pi$ network, while the first regulating circuit acts on the T or $\pi$ network such that its input and output resistances are kept constant.

6 Claims, 3 Drawing Sheets

VARIABLE ATTENUATION NETWORK WITH CONSTANT INPUT AND OUTPUT RESISTANCES

The present invention concerns an attenuation network and more particularly a variable attenuation network with constant input and output resistances.

In electrical engineering, attenuation networks with constant input and output resistances frequently consists of so-called bridged T-networks with series symmetry, which comprise a buffer series resistance $R_A = R*q$, two identical branch resistances $R_C$ and $R_D$ and a shunt resistance $R_B = R/q$ in which R is an arbitrarily selected resistance value and q is a parameter. When changing the values of the resistors $R_A$ and $R_B$ by changing the parameter q, duality is always maintained between $R_A$ and $R_B$: $R_A * R_B = (R*q)(R/q) = R^2$. Due to this fact, the input and output resistances of the network will always be kept constant. In addition, longitudinal T-or $\pi$ networks have the advantage that their input and output resistances are equal. Since the DC and AC resistances of a field effect transistor are almost identical, the resistances $R_A$ and $R_B$ can be replaced by field effect transistors, which act as voltage-controlled resistances.

Figure 2:
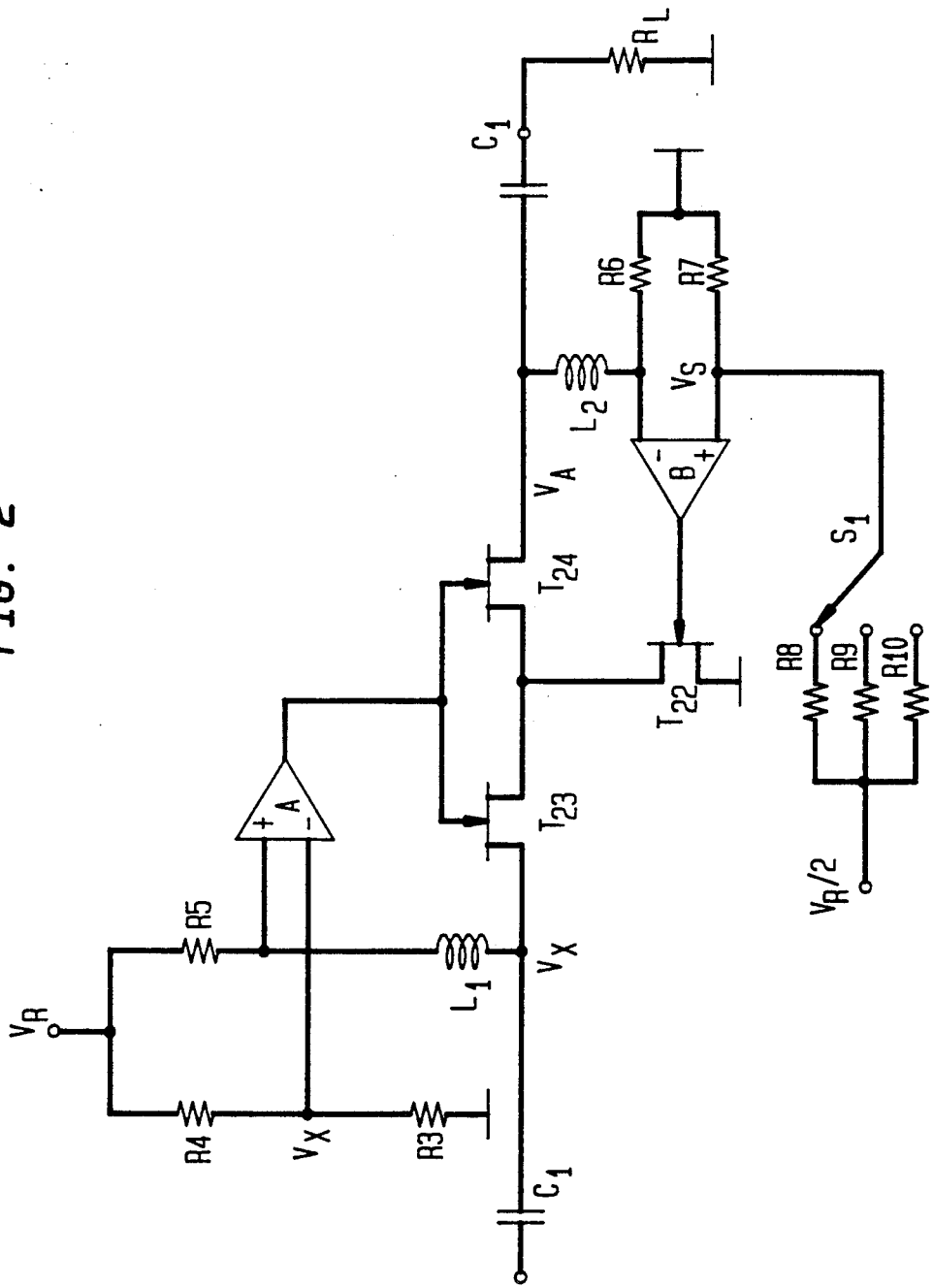

In this case, the adjustment of the shunt resistance is often done in parallel with the adjustment of the shunt resistance of a second, identical T network, after its bridging series resistance has been varied to the same extent as the series resistance of the first T network and its output resistance has been compared in a bridge circuit with a reference resistance and kept constant by adjusting the shunt resistance of the second T network. Such a solution is known from IEEE Transactions on Microwave Theory and Techniques, Vol. MTT-34, No. 12, December 1986, page 1569 ff. FIG. 2 on page 1570 thereof shows a monolithic variable attenuator comprising an attenuator cell, a reference cell and an operational amplifier. The reference cell comprises a bridged T-network, whose output resistance is part of a bridge with a corresponding 50 Ohm resistor and two 2kOHm resistors. The two 2 kOhm resistors are on one side further connected to a reference voltage $V_{DD}$ and on the other side further connected to the inverting and non-inverting input of the operational amplifier, respectively. The output of the operational amplifier is connected to the gate of a first FET and to the gate of a second FET, which form the electronically controllable shunt resistors of the bridged T-network in the attenuator and reference cell. The operational amplifier therefore maintains a 50 Ohm environment by adjusting the shunt FET gate voltage in response to an arbitrary voltage variation on the gates of the FET'3 s, which form the electronically controllable series bridging resistors of the networks. As will be appreciated by one skilled in the art, it is known to incorporate the input-or output resistance of a $\pi$ or T-network comprising at least two electronically controllable resistors into a bridge, which is balanced by an operational amplifier. A disadvantage of this solution is that it is necessary to use a second, identical T or $\pi$ network, which can only be manufactured at great expense. In this case, the attenuation of the attenuation network is dependent on the temperature stability of the components used for the first T network. In addition, its control characteristic curve is non-linear.

An aspect of the present invention is therefore to create a variable attenuation network with a T or $\pi$ network of the kind described above, which contains either a single T network or a single $\pi$ network.

One advantage of the proposed attenuator is that two regulating circuits operate on only one T or $\pi$ network to set the attenuation and to keep the input and output impedances constant. As a result, problems of regulating the T or $\pi$ network that is employed in accordance with a second T or $\pi$ network are eliminated. The improved temperature stability of the attenuation network is now dependent only upon passive components. In this case the attenuation is linear with respect to the established control or reference voltage $V_s$.

Figure 3:
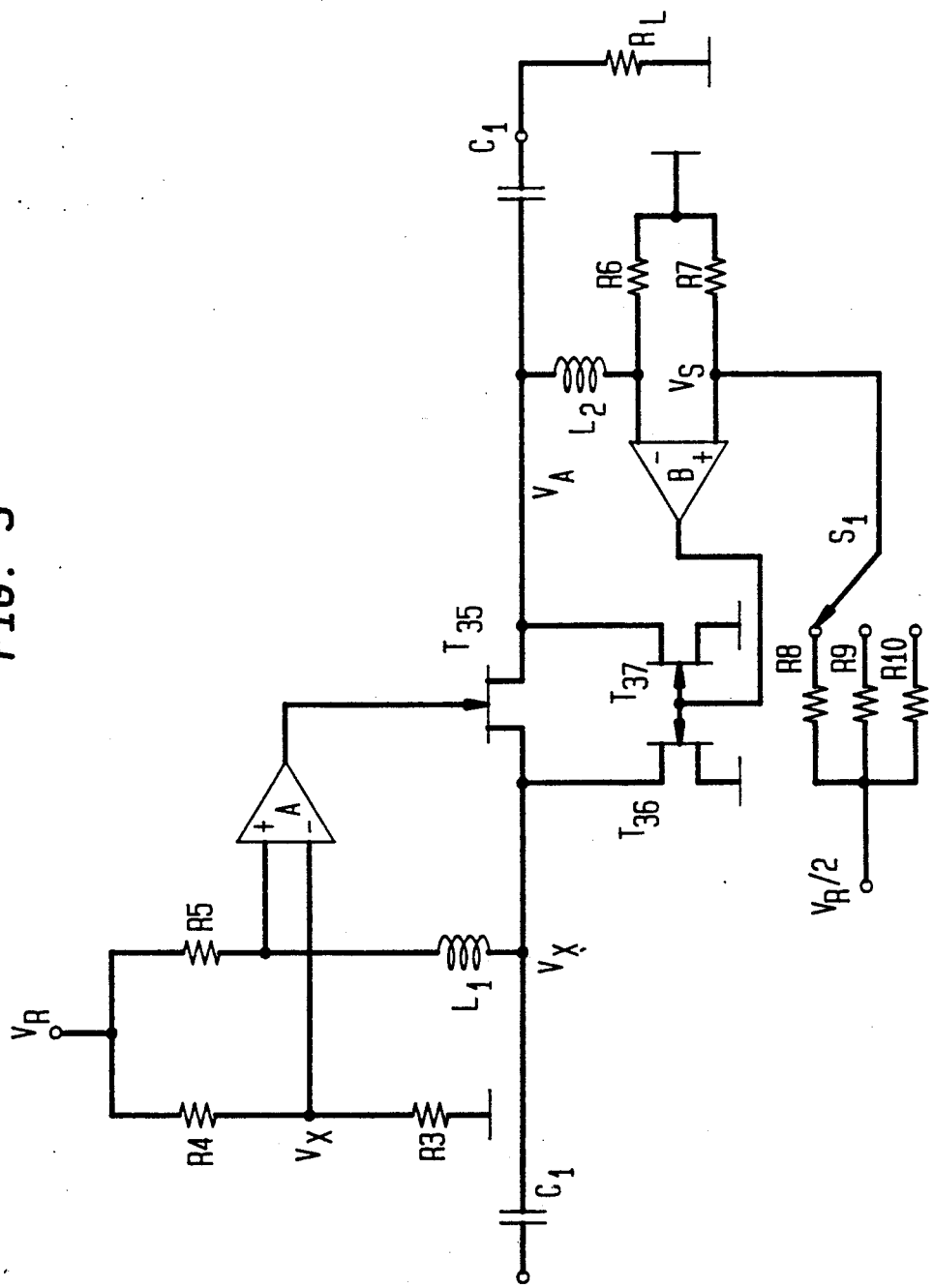

A number of embodiments are described in greater detail below, with the aid of the drawings, in which FIG. 1 shows an attenuation network according to the invention, with a bridged T network;

FIG. 2 shows an attenuation network according to the invention with an unbridged T network; and FIG. 3 shows the attenuation network according to the invention with a $\pi$ network.

FIG. 1 shows a bridged T network with a field effect transistor T11 forming a buffer series resistance, with series resistors R1 and R2 and a field effect transistor T12 forming the shunt resistance. The T network is integrated in a first bridge circuit with resistors R3, R4 and R5; input resistance $R_{in}$ of the T network forms the fourth resistance in the bridge circuit. The T-network is also integrated into a second bridge circuit comprising the resistance of the T-network, resistors R6 and R7 and one of the resistors R8, R9 or R10. In the second bridge the voltage drop across the T-network (the voltage drop across the longitudinal resistance of the respective T-network) is compared with the voltage drop across resistors R8 and R9 or R10 by an operational amplifier B. The first bridge circuit is connected to a supply voltage $V_R$. Resistors R8, R9 and R10, which are connected to the voltage $V_R/2$, can be connected as desired to the second bridge circuit by means of a switch S1, so that a desired attenuation can be obtained. The balancing branch of the first bridge circuit comprises an operational amplifier A, whose output is connected to a control electrode (gate) of transistor T11. Similarly, the balancing branch of the second bridge circuit comprises an operational amplifier B, whose output is connected to the gate of the transistor T12. For the sake of simplicity the resistance values for the load resistor $R_L$ connected to the output of the T-network as well as for the resistors R1, R2, R3, R4, R5, R7, and R8 are selected to be equal to the value of the wave resistance $R_W$. The resistances for R9 and R10 are select to be $3R_W$ and $7R$, respectively. In this case, resistor R6 must correspond to the resistance of load resistor $R_L$ of the attenuation network, which has been selected to be equal to the value of wave resistance $R_W$. Other resistance combinations are conceivable, for example, for other attenuation levels. Coil L1, which connects the input of the T-network with resistor R5 and the non-inverting input of the operational amplifier A and coil L2, which connects the output of the T-network with resistor $R_L$ serve to isolate the T-network from the rest of the circuit when alternating voltage (AC) is used. Capacitor C1, which connects the input of the T-network with the input of the whole attenuation network and capacitor C2, which connects the output of the T-network with resistor $R_L$ serve to block direct voltages (DC).

Therefore resistor R6 serves as the load resistance for DC voltages (coil L2 conducts; capacitor C2 blocks)

and resistor $R_L$ serves as load resistance for AC voltages (coil L2 blocks; capacitor C2 conducts).

The circuit operates in the following manner:

In the first bridge circuit, the DC voltage on the input of the T-network, which depends on the input resistance of the T-network and the DC voltage on the resistor R3 are applied to the inputs of the operational amplifier A, which regulates transistor T11 such that the voltages are always kept equal. After the bridge has been balanced and for R3=R4, the voltage (value) $V_X = V_R*(R3/R3+R4) = V_R/2$ is therefore present at both inputs of operational amplifier A as well as on the input of the T-network. Considering above selection of the bridge resistors (R3, R4, R5=$R_W$) it becomes apparent that the input (and the output) resistance of the T-network in the balanced bridge are always equal to the wave resistance $R_W$.

The second bridge, which is provided to obtain a desired attenuation of the T-network, operates as follows. The DC voltage $V_R/2(V_R/2$, equal to $V_X$) at the input of the T-network, is divided by the resistance of the T-network and the Resistor R6. The resulting DC voltage $V_A$ is applied to the inverting input of the operational amplifier B. The voltage $V_R/2$, which is present at one end of the resistors R8, R9, R10, is divided by one of the three resistors R8, R9, R10 and resistor R7 (resistor R8 or R9 or R10 is selected according to the desired attenuation by switch S1). The resulting DC voltage $V_S$ is applied to the non-inverting input of operational amplifier B. The voltages $V_A$, $V_S$ are compared and kept equal by the operational amplifier B, which regulates transistor T12 in order to keep the second bridge balanced. As a result, the resistance of the T-network is equal to the resistor R8, R9 or R10, which is selected by the switch S1 and the desired attenuation is obtained.

In order for the attention of the T-network to be equal for DC and AC voltages, resistors R6 and $R_L$ must have the same value. Typically, both are equal to the wave resistance $R_W$.

Once the input DC voltage $V_X$ of the T-network is known, the value of the output DC voltage $V_A$ for a desired attenuation IL can be computed by the formula IL=20 log $(V_A/V_X)$. For three different attenuation settings required by the operator of the network the resistors R8, R9 and R10 can be computed as follows:

For $R_W$=R3, R4, R7, replacement of the variables $V_A$ and $V_X$ in the formula IL=20 log $(V_A V_X)$ by $V_A = V_S = (V_R/2*R7)/(R7+R8$ or R9 or R10) and by $V_X = (V_R*R3)/(R3+R4)$ leads to the following formula:

$$IL = 20 \log \frac{R_W}{R_W + R8 \text{ or } R9 \text{ or } R10}$$

In this case, the connection of resistor R8=$R_W$ results in an attenuation of 6dB, the connection of the resistor R9=3$R_W$ gives an attenuation of 12dB and the connection of resistor R10=7$R_W$ gives an attenuation of 18dB. In this case, the respective input and output resistances of the attenuation network are again kept constant by operational amplifier A, which compares the input resistance $R_{in}$ of the T network with resistor R3 and controls field effect transistor T11 accordingly.

FIG. 2 shows another embodiment of the invention. The bridged T network shown in FIG. 1 is replaced here by an unbridged T network, which is equivalent in this circuit with regard to its four-pole equivalent parameters, comprising two variable series resistances (field effect transistors T23 and T24) and a variable shunt resistance (field effect transistor T22). The control electrodes of field effect transistors T23 and T24 are in this case connected to the output of operational amplifier A. The control electrode of field effect transistor T22 is connected to the output of operational amplifier B.

FIG. 3 shows a third embodiment of the invention. The bridged T network shown in FIG. 1 is replaced here by a $\pi$ network, which is equivalent in this circuit with regard to its four-pole equivalent parameters, comprising a variable series resistance (field effect transistor T35) and two variable shunt resistances (field effect transistors T36 and T37). The control electrode of field effect transistor T35 is in this case connected to the output of operational amplifier A. The control electrodes of field effect transistors T36 and T37 are connected to the output of the operational amplifier B. The circuits shown in FIG. 2 and FIG. 3 operate in substantially the same manner as that shown in FIG. 1.

For equal attenuations and equal input and output resistances, the four-pole parameters for the bridged T network, the simple T network and the $\pi$ network take on the same value, through control by the respective field effect transistors.

To obtain higher attenuation values, two (or more) identical T or $\pi$ networks may be connected together in series. In this case the additional variable resistances are controlled in parallel with the corresponding variable resistances of the first T or $\pi$ network.

I claim:

1. A variable attenuation network having a constant input resistance and a constant output resistance, comprising:
    a bridged T-network having series symmetry with an electronically controllable series bridging resistance provided by a first transistor and an electronically controllable shunt resistance provided by a second transistor having one main electrode connected to a junction between a pair of balanced resistors connected in series between main electrodes of the first transistor, wherein a control electrode of said first transistor is connected to an output of a first operational amplifier and a control electrode of said second transistor is connected to an output of a second operational amplifier;
    the input resistance of said variable attenuation network being part of a first bridge comprising three other resistances in corresponding branches, the respective inputs of said first operational amplifier being connected to the other resistances in the corresponding branches of said first bridge;
    a series bridging resistance of said T-network being part of a resistance of a second bridge comprising three other resistances in corresponding branches;
    means, coupled to the second bridge, for selecting the resistance of the second bridge according to a required attenuation; and
    respective inputs of said second operational amplifier being connected to the other resistances in the corresponding branches of said second bridge.

2. A variable attenuation network according to claim 1 comprising:
    a capacitor coupled between an input of the attenuation network and an input of the bridged T-network;

a further capacitor coupled between an output of the attenuation network and an output of the bridged T-network;

a coil coupled between an input of the bridged T-network and a corresponding input of the first operational amplifier;

a further coil coupled between an output of the bridged T-network and a corresponding input of the second operational amplifier.

3. A variable attenuation network having a constant input resistance and a constant output resistance, comprising:

a T-network having series symmetry with two electronically controllable series resistances provided by first and second transistors having their main electrodes connected in series and an electronically controllable shunt resistance provided by a third transistor having one main electrode connected to a junction between respective main electrodes of the first and second transistors, wherein respective control electrodes of said first and second transistors are connected to an output of a first operational amplifier and a control electrode of said third transistor is connected to an output of a second operational amplifier;

the input resistance of said variable attenuation network being part of a first bridge comprising three other resistances in corresponding branches;

respective inputs of said first operational amplifier being connected to the other resistances in the corresponding branches of said first bridge;

a series resistances of said T-network being part of a resistance of a second bridge comprising three other resistances in corresponding branches;

means, coupled to the second bridge, for selecting the resistance of the second bridge according to a required attenuation; and respective inputs of said second operational amplifier are connected to the other resistances in the corresponding branches of said second bridge.

4. A variable attenuation network according to claim 3, comprising:

a capacitor coupled between an input of the attenuation network and an input of the T-network;

a further capacitor coupled between an output of the attenuation network and an output of the T-network;

a coil coupled between an input of the T-network and a corresponding input of the first operational amplifier;

a further coil coupled between an output of the T-network and a corresponding input of the second operational amplifier.

5. A variable attenuation network having a constant input resistance and a constant output resistance, comprising:

a $\pi$-network having series symmetry with an electronically controllable series resistance provided by a first transistor and two electronically controllable shunt resistances provided by respective second and third transistors each having one main electrode connected to respective main electrode of the first transistor, wherein a control electrode of said first transistor is connected to an output of a first operational amplifier and respective control electrodes of said second and third transistors are connected to an output of a second operational amplifier;

the input resistance of said variable attenuation network being part of a first bridge comprising three other resistances in corresponding branches;

respective inputs of said first operational amplifier being connected to the other resistances in the corresponding branches of said first bridge;

a series resistance of said $\pi$-network being part of a resistance of a second bridge comprising three other resistances in corresponding branches;

means, coupled to the second bridge, for selecting the resistance of the second bridge according to a required attenuation; and respective inputs of said second operational amplifier are connected to the other resistances in the corresponding branches of said second bridge.

6. A variable attenuation network according to claim 5, comprising:

a capacitor coupled between an input of the attenuation network and an input of the $\pi$-network;

a further capacitor coupled between an output of the attenuation network and an output of the $\pi$-network;

a coil coupled between an input of the $\pi$-network and a corresponding input of the first operational amplifier;

a further coil coupled between an output of the $\pi$-network and a corresponding input of the second operational amplifier.

* * * * *